United States Patent
Nagano et al.

(10) Patent No.: US 7,525,154 B2
(45) Date of Patent: Apr. 28, 2009

(54) SEMICONDUCTOR SUBSTRATE, MANUFACTURING METHOD THEREFOR, AND SEMICONDUCTOR DEVICE

(75) Inventors: Hajime Nagano, Yokohama (JP); Ichiro Mizushima, Yokohama (JP); Kiyotaka Miyano, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 382 days.

(21) Appl. No.: 10/852,511

(22) Filed: May 25, 2004

(65) Prior Publication Data
US 2005/0205929 A1 Sep. 22, 2005

(30) Foreign Application Priority Data
Mar. 16, 2004 (JP) .............................. 2004-074969

(51) Int. Cl.
*H01L 29/72* (2006.01)
(52) U.S. Cl. .................. 257/347; 257/190; 257/194; 257/401; 257/616; 257/618
(58) Field of Classification Search ................. 257/190, 257/194, 347, 401, 616, 618
See application file for complete search history.

(56) References Cited

U.S. PATENT DOCUMENTS

| | | | |
|---|---|---|---|
| 5,155,571 A | 10/1992 | Wang et al. | |
| 5,847,419 A * | 12/1998 | Imai et al. | 257/192 |
| 6,399,970 B2 | 6/2002 | Kubo et al. | |
| 6,498,359 B2 * | 12/2002 | Schmidt et al. | 257/190 |
| 6,569,729 B1 * | 5/2003 | Wu et al. | 438/219 |
| 6,750,486 B2 * | 6/2004 | Sugawara et al. | 257/265 |
| 6,767,793 B2 * | 7/2004 | Clark et al. | 438/286 |
| 6,943,407 B2 * | 9/2005 | Ouyang et al. | 257/329 |
| 7,034,362 B2 * | 4/2006 | Rim | 257/351 |
| 7,049,661 B2 * | 5/2006 | Yamada et al. | 257/347 |
| 2001/0003364 A1 | 6/2001 | Sugawara et al. | |
| 2002/0125502 A1 | 9/2002 | Baba et al. | |
| 2003/0057490 A1 | 3/2003 | Nagano et al. | |
| 2003/0122124 A1 | 7/2003 | Nagano et al. | |

(Continued)

FOREIGN PATENT DOCUMENTS

DE 102 18 381 A1 2/2004

(Continued)

OTHER PUBLICATIONS

M. Yang, et al. "High-Performance CMOS SOI Device on Hybrid Crystal Oriented Substrates". IEDM 2003.*

(Continued)

*Primary Examiner*—Edward Wojciechowicz
(74) *Attorney, Agent, or Firm*—Finnegan, Henderson, Farabow, Garrett & Dunner, L.L.P.

(57) ABSTRACT

A semiconductor substrate and a manufacturing method therefore, and a semiconductor device using the semiconductor substrate comprise a strained Si region and unstrained Si region formed at substantially the same level. In an aspect of the invention, a semiconductor substrate is provided by comprising a support substrate, a first semiconductor region including a first silicon layer formed above the support substrate, a second semiconductor region including a strained second silicon layer formed above the support substrate, a surface of the second silicon layer being formed at substantially the same level as a surface of the first silicon layer, and an insulating film at an interface between the first semiconductor region and the second semiconductor region.

8 Claims, 7 Drawing Sheets

U.S. PATENT DOCUMENTS

| | | | |
|---|---|---|---|
| 2004/0041174 A1 | 3/2004 | Okihara | |
| 2005/0067647 A1* | 3/2005 | Bulsara et al. | 257/301 |
| 2005/0127400 A1* | 6/2005 | Yeo et al. | 257/194 |
| 2005/0156268 A1* | 7/2005 | Chu | 257/478 |
| 2005/0189589 A1* | 9/2005 | Zhu et al. | 257/347 |
| 2005/0191797 A1* | 9/2005 | Usuda et al. | 438/152 |
| 2005/0205929 A1* | 9/2005 | Nagano et al. | 257/347 |
| 2005/0239241 A1* | 10/2005 | Ouyang et al. | 438/197 |

FOREIGN PATENT DOCUMENTS

| | | |
|---|---|---|
| EP | 0 838 858 A2 | 4/1998 |
| EP | 1 193 754 A2 | 4/2002 |
| JP | 09-219524 | 8/1997 |
| JP | 2003-100900 | 4/2003 |
| JP | 2004-165197 | 6/2004 |
| WO | WO 03/017336 A2 | 2/2003 |
| WO | WO 2005/064148 A1 | 7/2004 |
| WO | WO 2005/057612 A2 | 6/2005 |

OTHER PUBLICATIONS

European Search Report issued by the European Patent Office on Jun. 29, 2007, for European Patent Application No. 04011379.7-1235.

Chinese Office Action dated May 12, 2006, issued in counterpart Chinese Application No. 2005-100553053.

Japanese Patent Office "Notification of Reasons for Rejection" mailed Aug. 29, 2006, issued in counterpart Japanese Patent Application No. 2004-074969.

* cited by examiner

SEMICONDUCTOR SUBSTRATE, MANUFACTURING METHOD THEREFOR, AND SEMICONDUCTOR DEVICE

CROSS-REFERENCE TO RELATED APPLICATIONS

This application is based upon and claims the benefit of priority from prior Japanese Patent Application No. 2004-074969, filed Mar. 16, 2004, the entire contents of which are incorporated herein by reference.

BACKGROUND OF THE INVENTION

1. Field of the Invention

The present invention relates to a semiconductor substrate, manufacturing method therefor, and semiconductor device and, more particularly, to a semiconductor substrate including, e.g., regions with different strained states in a surface layer, i.e., a strained semiconductor region and unstrained semiconductor region, a manufacturing method therefor, and a semiconductor device using the semiconductor substrate.

2. Description of the Related Art

In a strained silicon under tensile stress, it is known that mobility of electrons in Si increases due to the effect of internal stress in the strained Si layer. The strained Si layer is defined as an Si layer whose lattice constant deviates from an original Si lattice constant owing to the stress. An Si layer without stress having an original Si lattice constant will be called as a relaxed Si layer, compared to the strained Si layer. Also for silicon germanium (SiGe) to be described later, an SiGe layer with stress will be called a strained SiGe layer, and an SiGe layer without stress will be called as a relaxed SiGe layer.

The operation speed of a semiconductor device can be increased when the device is formed using, e.g., a strained Si layer with tensile stress for a channel of an n-channel metal-oxide semiconductor field effect transistor (MOSFET: to be referred to as an nMOS hereinafter). A high-performance, advanced-function semiconductor device can be manufactured by embedding semiconductor devices with various functions on a strained Si substrate having a strained Si layer.

Although the electron mobility increases in an Si layer under tensile stress, but the hole mobility becomes equal to or lower than that in the bulk Si. Strained Si is therefore suitable for an nMOS in terms of semiconductor device characteristics. A pMOS favors strained SiGe which is higher in hole mobility than Si. In this situation, a semiconductor substrate having two semiconductor regions with different strained states has been proposed. An example of the substrate is shown in FIGS. 18A and 18B.

This example employs a strained silicon on insulator (SOI) substrate 3 (FIG. 18A) having a thin strained Si layer 21 formed above a substrate 1 and a buried oxide film (BOX) layer 11 and relaxed SiGe layer 12 without stress which are sandwiched between the strained Si layer 21 and the Si substrate 1. In this semiconductor substrate, a relaxed Si region B having a relaxed Si layer 22 without stress is formed on part of the substrate surface while a strained Si region A having the strained Si layer 21 remains in the rest of the surface.

The relaxed Si region B can be formed as follows. First, the entire surface is thermally oxidized to form an oxide film ($SiO_2$ film), and the strained Si layer 21 in the region B is exposed by patterning. In the region B, the Si substrate 1 is exposed by selectively removing the exposed strained Si layer 21, relaxed SiGe layer 12, and BOX layer 11. A relaxed Si layer 22 without stress is formed on the Si substrate 1 by selective epitaxial growth, then the $SiO_2$ film on the strained Si layer 21 surface is removed. In this manner, a semiconductor substrate having the strained Si region A whose surface is the strained Si layer 21 and the relaxed Si region B whose surface is the relaxed Si layer 22 without stress is formed, as shown in FIG. 18B.

In a process of manufacturing a semiconductor substrate having the strained Si region A and relaxed Si region B by selective epitaxial growth, for example, with the structure shown in FIG. 18B, annealing at a relatively high temperature such as thermal oxidization or hydrogen annealing is generally performed before selective epitaxial growth. The annealing generates misfit dislocations near an interface between the strained Si layer 21 and the relaxed SiGe layer 12 due to the difference between their lattice constants, thereby relaxing the strain of the strained Si layer 21. Thermal oxidization of the thin strained Si layer 21 makes the layer 21 thinner, and also makes it difficult to control the thickness of the strained Si layer 21, exactly.

During the annealing, Ge diffuses from the relaxed SiGe layer with high Ge concentration into the strained Si layer 21 formed on the relaxed SiGe layer. As a result, the strain of the strained Si layer 21 decreases, failing to sufficiently increase the electron mobility.

Another example is a semiconductor substrate having a strained Si region A and relaxed Si region B by using a strained Si substrate 2, as a starting material, in which a strained Si layer 21 is formed on an SiGe buffer layer 31 on an Si substrate 1, as shown in FIG. 19A. In the SiGe buffer layer 31, its Ge concentration is low in a portion close to the Si substrate 1 in order to suppress the generation of above-mentioned misfit dislocations, and gradually increases toward the surface.

In this example, the relaxed Si region B is formed as follows. First, part of the strained Si layer 21 is covered with a mask, and the relaxed Si region B being formed an Si layer without stress is exposed. Then, the strained Si layer 21 and SiGe buffer layer 31 in the region B are selectively etched away to expose the surface of the unstrained Si substrate 1. The exposed surface is defined as the relaxed Si region B, as shown in FIG. 19B. In this structure, a step is formed between the strained Si region A on the SiGe buffer layer 31 and the relaxed Si region B from which the SiGe buffer layer 31 is removed.

As described above, the SiGe buffer layer 31 is a so-called graded SiGe layer in which the Ge concentration in Si is not uniform in the direction of thickness, lower near the Si substrate 1, and gradually higher toward the surface. In manufacturing a semiconductor substrate with the structure shown in FIG. 19B, the SiGe buffer layer 31 is etched away, as described above. However, since the Ge concentration in the SiGe buffer layer 31 near the Si substrate 1 is low, the selectivity in the etching between the SiGe buffer layer 31 and Si substrate 1 becomes low, failing to control the etching amount. Consequently, the etching uniformity in a wafer, between wafers and among lots becomes worse, and the level of the relaxed Si region B becomes nonuniform.

When a semiconductor device is manufactured using a semiconductor substrate suffering the above problems, for example, planarization becomes difficult in the manufacturing process due to the step of the substrate, and desired patterning is hardly achieved. The characteristics of manufactured semiconductor devices vary owing to, e.g., variations in the thickness of the strained Si layer 21 in the surface or variations in the Ge concentration of the SiGe layer 12 in contact with the strained Si layer 21, failing to obtain desired characteristics.

The SiGe buffer layer 31 contains many misfit dislocations in order to relax the difference in lattice constant between the Si substrate 1 and the SiGe buffer layer 31. When a deep semiconductor element, e.g., a trench memory cell, is formed in the strained Si region A having misfit dislocations, the trench may cross the misfit dislocation. The dislocation acts as a current leakage path, and the element characteristics is degraded by an increased leakage current.

In order to manufacture a semiconductor device with excellent desired characteristics, a semiconductor substrate must be obtained in which (1) the entire substrate is flat without any step between the strained Si region and the relaxed Si region, (2) the strained Si layer and relaxed Si layer, in which semiconductor elements are to be formed, are uniform in, for example, the thicknesses and impurity concentrations, and (3) lattice defects such as misfit dislocations do not exist in a trench formation region in the substrate.

BRIEF SUMMARY OF THE INVENTION

In an aspect of the invention, a semiconductor substrate comprises a support substrate, a first semiconductor region including a first silicon layer formed above the support substrate, a second semiconductor region including a strained second silicon layer formed above the support substrate, a surface of the second silicon layer being formed at substantially the same level as a surface of the first silicon layer, and an insulating film at an interface between the first semiconductor region and the second semiconductor region.

In another aspect, a semiconductor device comprises a support substrate, a first semiconductor region including a second silicon layer formed on a first silicon layer above the support substrate, a second semiconductor region including a strained third silicon layer formed on a silicon germanium layer above the support substrate, a surface of the third silicon layer being formed at substantially the same level as a surface of the second silicon layer, an insulating film which is formed on an interface between the first semiconductor region and the second semiconductor region below an isolation insulator formed between the first semiconductor region and the second semiconductor region, a trench memory cell which is formed in the first semiconductor region, and a field effect transistor which is formed in the second semiconductor region.

In another aspect, a semiconductor substrate manufacturing method is comprised for forming a first insulating film on a semiconductor substrate including a first semiconductor layer, patterning the first insulating film, removing part of the semiconductor substrate to form a recess, forming a second insulating film on an entire surface, removing the second insulating film from a bottom surface in the recess, forming a second semiconductor layer in the recess from a material different from a material of the first semiconductor layer, removing the first and second insulating films from a surface of the first semiconductor layer, and simultaneously forming a first silicon layer on the first semiconductor layer and a second silicon layer on the second semiconductor layer, a surface of the second silicon layer being substantially flush with a surface of the first silicon layer.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Embodiments of the present invention will be described in detail below with reference to the several views of the accompanying drawing.

First Embodiment

Figure 1:
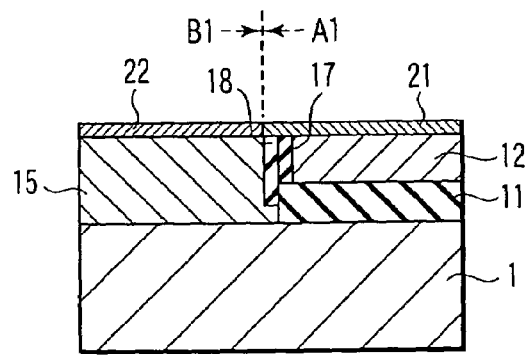
FIG. 1 is a sectional view showing an example of a semiconductor substrate according to the first embodiment.

As shown in FIG. 1, the first embodiment uses, as a starting material, a substrate 4 (to be referred to as a silicon germanium on insulator (SGOI) substrate hereinafter) prepared by forming a relaxed SiGe layer 12 on a BOX layer 11 serving as an insulating layer on an Si substrate 1 serving as a support substrate. A semiconductor substrate according to the first embodiment has a strained Si region A1 including a strained Si layer 21 formed on the relaxed SiGe layer 12 by an epitaxial growth of Si, and a relaxed Si region B1 including a relaxed Si layer 22 without stress that is formed on a selectively epitaxially grown Si layer 15 at almost the same level as the strained Si layer 21. According to the feature of the semiconductor substrate, control of the film thickness of the strained Si layer 21 is facilitated at high quality.

The manufacturing process will be explained with reference to FIGS. 2A to 2F.

Figure 2A:
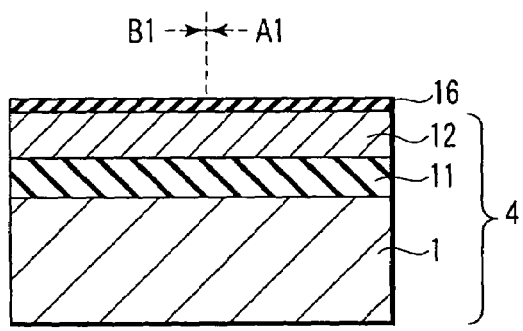
FIGS. 2A to 2F are sectional views for explaining an example of a semiconductor substrate manufacturing process according to the first embodiment.

(1) As shown in FIG. 2A, a silicon oxide film ($SiO_2$ film) 16 is formed on the entire surface of an SGOI substrate 4. The SGOI substrate 4 is prepared by forming, for example, a 100-nm thick relaxed SiGe layer 12 having a Ge concentration of 15% on a 100-nm thick BOX layer 11 on an Si substrate 1. The $SiO_2$ film 16 has a thickness of, e.g., 100 nm and may be formed by low pressure chemical vapor deposition (LPCVD).

Figure 2D:
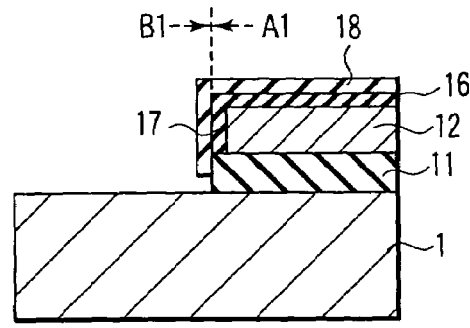
Figure 2B:
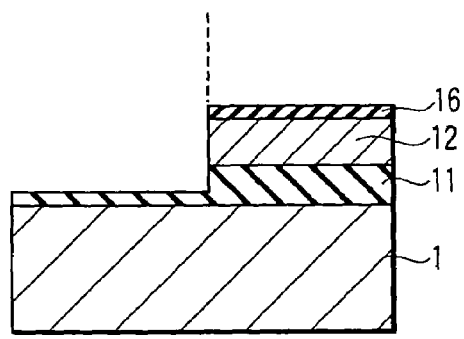

(2) As shown in FIG. 2B, the $SiO_2$ film 16 in the region B1 where a relaxed Si layer is to be formed is removed. The relaxed SiGe layer 12 and a part of the BOX layer 11 in the region B1 are etched away. Etching can be anisotropic or isotropic etching, but anisotropic etching such as reactive ion etching (RIE) is preferable for micropatterning.

Figure 2E:
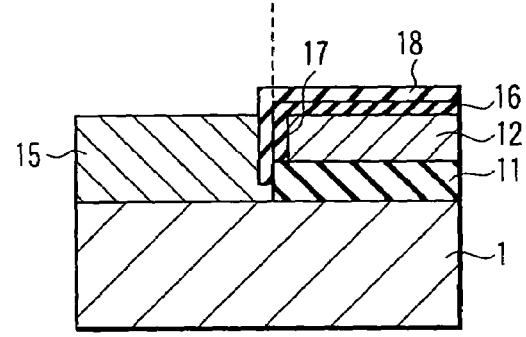
Figure 2C:
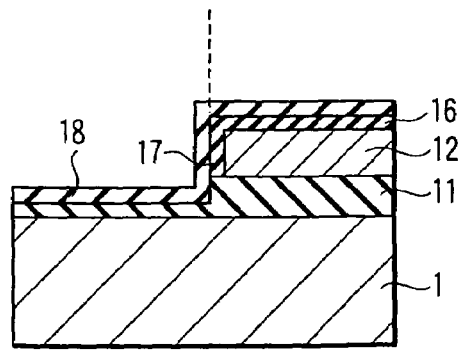

(3) As shown in FIG. 2C, a second $SiO_2$ film 17 is formed by thermal oxidization. Subsequently, a silicon nitride film (SiN film) 18 is deposited on the entire surface by, e.g., LPCVD. Although the first embodiment adopts the SiN film 18, another film such as an $SiO_2$ film may be used.

(4) As shown in FIG. 2D, the SiN film 18 deposited on the BOX layer 11 is etched by, e.g., RIE. The exposed BOX layer 11 is removed by wet etching to expose the Si substrate 1. Etching of the BOX layer 11 can be reactive etching such as RIE, but, for example, wet etching is preferable so as not to damage the surface of the Si substrate 1.

(5) As shown in FIG. 2E, an Si layer 15 is selectively epitaxially grown on the surface of the exposed Si substrate 1. As selective epitaxial growth conditions, for example, 0.25 slm of dichlorsilane ($SiH_2Cl_2$) and 0.1 slm of hydrogen chloride (HCl) are supplied using a hydrogen ($H_2$) carrier gas at a pressure of 10 Torr and a substrate temperature of 800° C. The growth thickness of the epitaxial Si layer 15 can be set equal to the total thickness of the relaxed SiGe layer 12 and BOX layer 11. If any damage exists in the surface of the Si substrate 1 in step (4), the crystal quality of the selectively epitaxially grown Si layer 15 degrades.

The epitaxial Si layer 15 can be grown by solid phase epitaxial growth instead of selective epitaxial growth in a vapor phase. Solid phase epitaxial growth is performed as follows. An amorphous Si film is deposited thicker than the SiGe layer 12 thickness on the entire surface. The Si film is annealed at a high temperature to change the amorphous Si film on the Si substrate 1 in the region B1 into a single-crystal epitaxial Si layer 15 by solid phase epitaxial growth. At this time, amorphous Si on the SiN film 18 in the region A1 changes into poly-crystal Si. In order to planarize the surface and to remove the poly-Si at the same time, chemical-mechanical polishing (CMP) is executed to form the structure shown in FIG. 2E.

(6) After that, the SiN film 18 and the $SiO_2$ films 16 and 17, which cover the relaxed SiGe layer 12, are sequentially removed by wet etching using a phosphoric acid-containing solution and dilute hydrofluoric acid. An Si layer is epitaxially grown on the entire surface to form Si layers 21 and 22.

Figure 2F:
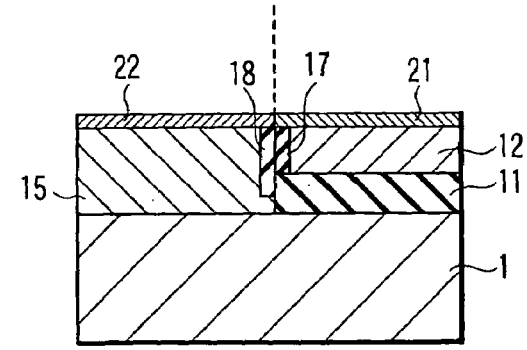

Epitaxial growth is done, e.g., to a thickness of 20 nm by using 300 slm of an $SiH_2Cl_2$ source gas at a pressure of 10 Torr and a temperature of 800° C. Accordingly, as shown in FIG. 2F, the strained Si layer 21 and the relaxed Si layer 22 without stress can be simultaneously formed at almost the same level on the relaxed SiGe layer 12 and the epitaxial Si layer 15, respectively.

The strained state of the surface of the semiconductor substrate manufactured according to the first embodiment was evaluated by Raman spectroscopy analysis. It was confirmed that the strained Si layer 21 was formed on the relaxed SiGe layer 12 and the relaxed Si layer 22 without stress was formed on the epitaxial Si layer 15.

Figure 3:
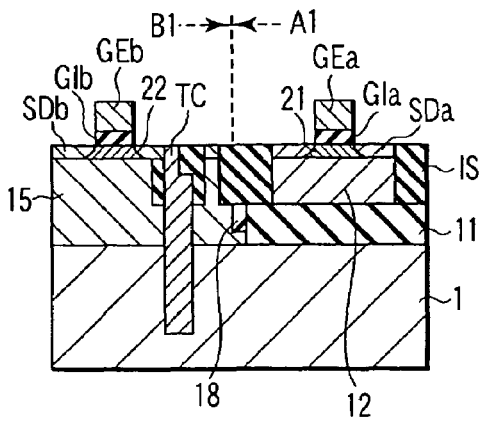
FIG. 3 is a sectional view showing an example of a semiconductor device using the semiconductor substrate according to the first embodiment.

As shown in FIG. 3, after forming an isolation IS in the semiconductor substrate, in the strained Si region A1, for example, an nMOS having a source/drain SDa, gate insulator GIa, and gate electrode GEa is formed. In the relaxed Si region B1, for example, a trench type dynamic random access memory (DRAM) cell having a source/drain SDb, gate insulator GIb, gate electrode GEb, and trench capacitor TC is formed. In the semiconductor device, part of the SiN film 18 remains below the isolation IS at the interface between the strained Si region A1 and the relaxed Si region B1. The SiN film 18 has an effect of completely isolating elements. The operation of the semiconductor device was evaluated to confirm that the operation speed was higher and the leakage current of the memory cell was lower than those of a semiconductor device manufactured by a conventional technique.

In this way, a semiconductor substrate can be manufactured in which both the strained Si region A1 having the strained Si layer 21 at the surface and the relaxed Si region B1 having the relaxed Si layer 22 without stress are formed at almost the same level. By using this semiconductor substrate, a higher-speed, higher-performance semiconductor device than a semiconductor device manufactured by a conventional method can be manufactured.

Second Embodiment

Figure 4:
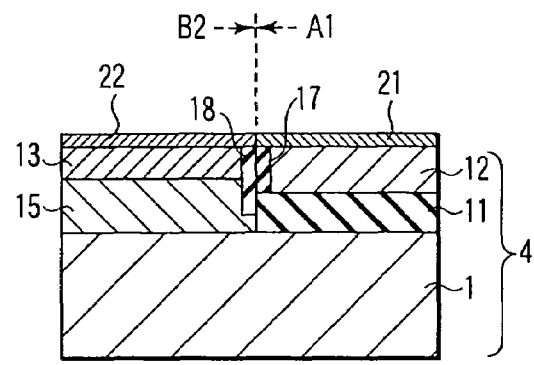
FIG. 4 is a sectional view showing an example of a semiconductor substrate according to the second embodiment.

The second embodiment is related to a semiconductor substrate preferable to manufacturing a complementary metal-oxide semiconductor (CMOS), based on the first embodiment. Similar to the first embodiment, as shown in FIG. 4, the second embodiment uses an SGOI 4, as a starting material, prepared by forming a relaxed SiGe layer 12 on a BOX layer 11 on an Si substrate 1. A semiconductor substrate according to the second embodiment has a strained Si region A1 including a strained Si layer 21 formed on the relaxed SiGe layer 12 on the BOX layer 11 by epitaxial growth of Si, and a relaxed Si region B2 including a relaxed Si layer 22 without stress that is formed on a strained SiGe layer 13 on a selectively epitaxially grown Si layer 15 at almost the same level as the strained Si layer 21. According to the feature of the semiconductor substrate, control of the film thicknesses of the strained Si layer 21 and relaxed Si layer 22 is facilitated at high quality.

The manufacturing process will be explained with reference to FIGS. 5A to 5C.

Figure 5A:
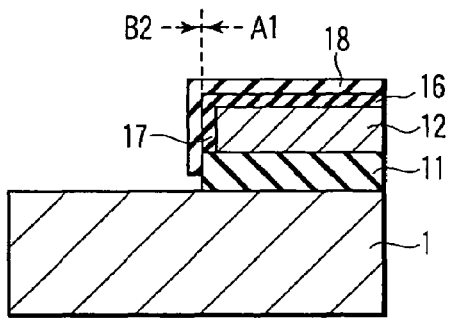
FIGS. 5A to 5C are sectional views for explaining an example of a semiconductor substrate manufacturing process according to the second embodiment.

FIG. 5A is a sectional view identical to FIG. 2D. Manufacturing steps up to the step of FIG. 5A are the same as steps (1) to (4) in the first embodiment, and will be briefly explained.

(1) For example, a 100-nm thick $SiO_2$ film 16 is formed on an SGOI substrate 4.

(2) The $SiO_2$ film 16, relaxed SiGe layer 12, and a part of BOX layer 11 are removed from the region B2 where the relaxed Si region B2 is being formed.

(3) A thermal oxide film 17 is formed, then an SiN film 18 is deposited on the entire surface.

(4) The SiN film 18 on the BOX layer 11 and the remaining BOX layer 11 are so removed as not to leave any damage in the Si substrate 1, thereby forming a structure shown in FIG. 5A.

Figure 5B:
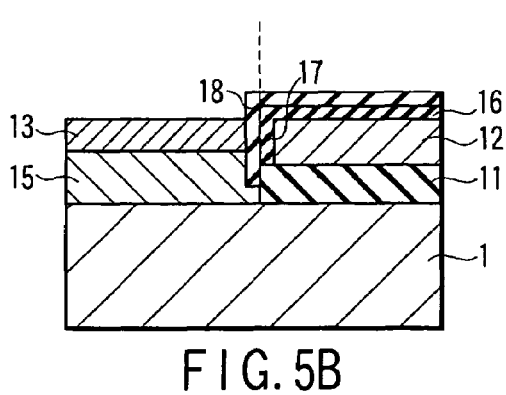
Figure 5C:
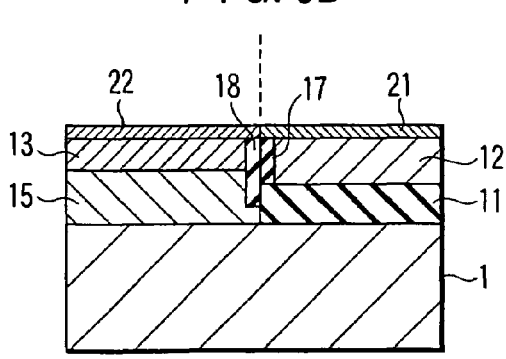

(5) As shown in FIG. 5B, an Si layer 15 and strained SiGe layer 13 are successively formed by selective epitaxial growth on only the Si substrate 1 exposed in the region B2. As selective epitaxial growth conditions of Si, 0.25 slm of $SiH_2Cl_2$ and 0.1 slm of HCl are supplied using an $H_2$ carrier gas at a pressure of 10 Torr and a temperature of 800° C. Subsequently, the strained SiGe layer 13 is epitaxially grown in the same apparatus using 0.4 slm of $SiH_2Cl_2$ and 0.2 slm of $GeH_4$ at a pressure of 10 Torr and a temperature of 800° C. The thickness of the strained SiGe layer 13 is preferably 10 to 30 nm. The total thickness of the epitaxial Si layer 15 and strained SiGe layer 13 can be set equal to the total thickness of the relaxed SiGe layer 12 and BOX layer 11.

(6) Thereafter, the SiN film 18 and the $SiO_2$ films 16 and 17, which cover the relaxed SiGe layer 12, are sequentially removed by wet etching using a phosphoric acid-containing solution and dilute hydrofluoric acid. An Si layer is epitaxially grown on the entire surface to form Si layers 21 and 22. Epitaxial growth is done to a thickness of 20 nm by using 300 slm of an $SiH_2Cl_2$ source gas at a pressure of 10 Torr and a temperature of 800° C. As shown in FIG. 5C, the strained Si layer 21 and the relaxed Si layer 22 without stress can be simultaneously formed at almost the same level on the relaxed SiGe layer 12 and on the strained SiGe layer 13 formed on the epitaxial Si layer 15, respectively.

Formation of the epitaxial Si layer 22 on the strained SiGe layer 13 can also be prevented by performing epitaxial growth while covering the strained SiGe layer 13 with, e.g., an $SiO_2$ film.

The strained state of the surface of the semiconductor substrate manufactured according to the second embodiment was evaluated by Raman spectroscopy analysis. It was confirmed that the strained Si layer 21 was formed on the relaxed SiGe layer 12 and the relaxed Si layer 22 without stress was formed on the strained SiGe layer 13 on the epitaxial Si layer 15.

Figure 6:
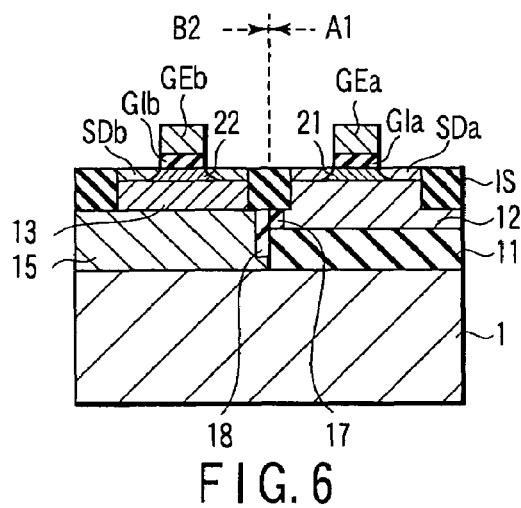
FIG. 6 is a sectional view showing an example of a semiconductor device using the semiconductor substrate according to the second embodiment.

As shown in FIG. 6, after forming an isolation IS in the semiconductor substrate, in the strained Si region A1, for example, an nMOS having a source/drain SDa, gate insulator GIa, and gate electrode GEa is formed. In the relaxed Si region B2, for example, a pMOS having a source/drain SDb, gate insulator GIb, and gate electrode GEb is formed. The pMOS is so manufactured as to form a channel in the strained SiGe layer 13. In the semiconductor device, the $SiO_2$ film 17 and SiN film 18 partially remain below the isolation IS at the interface between the strained Si region A1 and the relaxed Si region B2. The $SiO_2$ film 17 and SiN film 18 have an effect of completely isolating elements. As a result of evaluating the operation of the semiconductor device, the switching speeds of both the nMOS and pMOS increased in comparison with a semiconductor device manufactured by a conventional technique.

As described above, a semiconductor substrate can be manufactured in which both the strained Si region A1 having the strained Si layer 21 on the surface and the relaxed Si region B2 having the relaxed Si layer 22 without stress are formed at almost the same level. By using this semiconductor substrate, a higher-speed, higher-performance semiconductor device than a semiconductor device manufactured by a conventional method can be manufactured.

Third Embodiment

Figure 7:
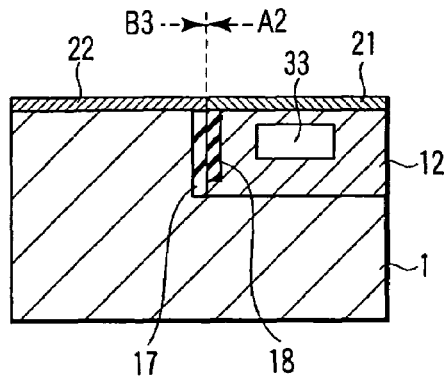
FIG. 7 is a sectional view showing an example of a semiconductor substrate according to the third embodiment.

As shown in FIG. 7, the third embodiment adopts a substrate (to be referred to as a silicon-germanium on nothing (SGON) hereinafter) prepared by forming a relaxed SiGe layer above a cavity, instead of the SGOI substrate 4. The third embodiment forms an SGON structure by using an Si substrate 1 as a starting material. As shown in FIG. 7, a semiconductor substrate according to the third embodiment has a strained Si region A2 including a strained Si layer 21 formed on a relaxed SiGe layer 12 having a cavity 33 by epitaxial growth of Si, and a relaxed Si region B3 including a relaxed Si layer 22 without stress that is formed on the Si substrate 1 at almost the same level as the strained Si layer 21. According to the feature of the semiconductor substrate, control of the film thickness of the strained Si layer 21 is facilitated at high quality. In addition, the third embodiment can reduce the number of manufacturing steps and the manufacturing cost in comparison with the first and second embodiments.

The manufacturing process of the third embodiment will be explained with reference to FIGS. 8A to 8F.

Figure 8A:
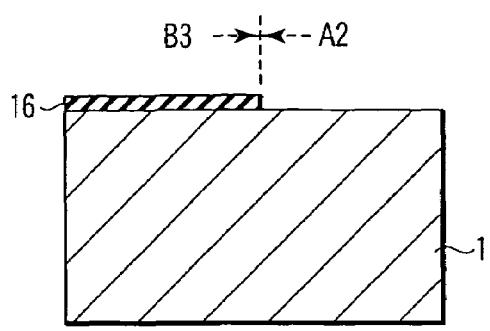
FIGS. 8A to 8F are sectional views for explaining an example of a semiconductor substrate manufacturing process according to the third embodiment.

(1) As shown in FIG. 8A, an $SiO_2$ film 16 is formed on an Si substrate 1 by, e.g., thermal oxidization or CVD. The $SiO_2$ film 16 in a region A2 where a strained Si layer is to be formed is patterned and removed.

Figure 8D:
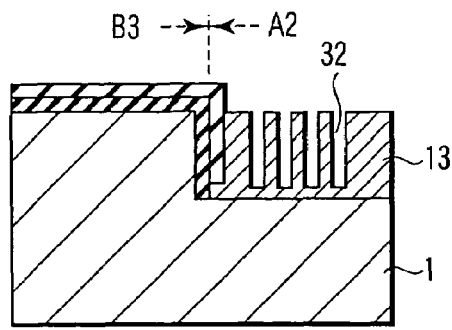
Figure 8B:
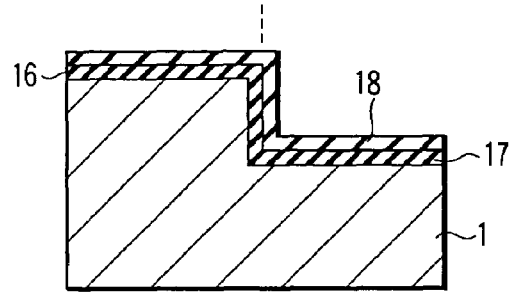
Figure 8E:
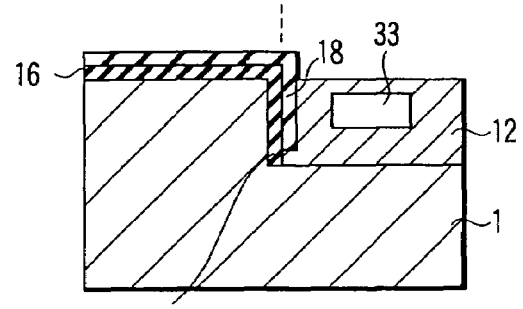

(2) As shown in FIG. 8B, the Si substrate 1 exposed in the region A2 is removed by, e.g., 2 μm. The entire surface is thermally oxidized to form a second $SiO_2$ film 17, and an SiN film 18 is formed on the entire surface by, e.g., CVD. Although the third embodiment employs the SiN film 18, another film such as an $SiO_2$ film can be used.

Figure 8C:
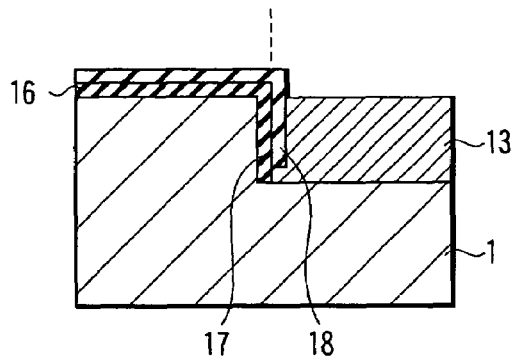

(3) As shown in FIG. 8C, the SiN film 18 in the region A2 is removed by anisotropic etching such as RIE. The exposed second $SiO_2$ film 17 is removed by, e.g., wet etching to expose the Si substrate 1. A strained SiGe layer 13 is formed on the exposed Si substrate 1 by selective epitaxial growth to a thickness of, e.g., 2 μm by which the Si substrate 1 has been removed in step (2). As selective epitaxial growth conditions of the SiGe layer 13, for example, 0.4 slm of $SiH_2Cl_2$ and 0.2 slm of $GeH_4$ are supplied using an $H_2$ carrier gas at a pressure of 10 Torr and a temperature of 800° C.

(4) As shown in FIG. 8D, a plurality of trenches 32 are formed in the strained SiGe layer 13. The trench 32 has, e.g., a diameter of 0.2 μm and a depth of 2 μm.

(5) The substrate having the trenches 32 is annealed in hydrogen. The annealing condition is, e.g., a temperature of 850° C., a pressure of 300 Torr, and a time of 10 min. In annealing, Si and Ge atoms in the strained SiGe layer 13 are migrated, and the trenches 32 couple with each other to form a cavity 33. At the same time, the strain of the SiGe layer is relaxed to form a relaxed SiGe layer 12 above the cavity, thus forming a structure shown in FIG. 8E.

Figure 8F:
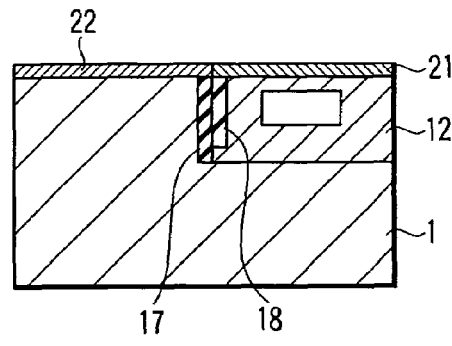

(6) The SiN film 18 and the $SiO_2$ films 16 and 17, which cover the surface of the Si substrate 1, are sequentially removed by wet etching using a phosphoric acid-containing solution and dilute hydrofluoric acid. An Si layer is epitaxially grown on the entire surface to form Si layers 21 and 22. Epitaxial growth is done to a thickness of 20 nm by using 300 slm of an $SiH_2Cl_2$ source gas at a pressure of 10 Torr and a temperature of 800° C. Consequently, as shown in FIG. 8F, the strained Si layer 21 and the relaxed Si layer 22 without stress can be formed at almost the same level on the relaxed SiGe layer 12 and the Si substrate 1, respectively.

The strained state of the surface of the semiconductor substrate manufactured according to the third embodiment was evaluated by Raman spectroscopy analysis. It was confirmed that the strained Si layer 21 was formed on the relaxed SiGe layer 12 and the relaxed Si layer 22 without stress was formed on the Si substrate 1.

Figure 9:
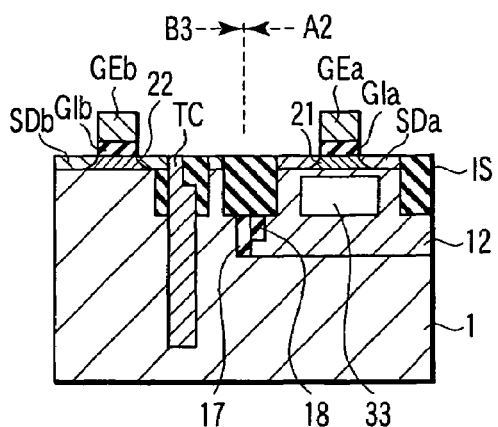
FIG. 9 is a sectional view showing an example of a semiconductor device using the semiconductor substrate according to the third embodiment.

As shown in FIG. 9, after forming an isolation IS in the semiconductor substrate, in the strained Si region A2, for example, an nMOS having a source/drain SDa, gate insulator GIa, and gate electrode GEa is formed. In the relaxed Si region B3, for example, a trench DRAM cell having a source/drain SDb, gate insulator GIb, gate electrode GEb, and trench capacitor TC is formed. In the semiconductor device, the $SiO_2$ film 17 and SiN film 18 partially remain below the isolation IS at the interface between the strained Si region A2 and the relaxed Si region B3. The $SiO_2$ film 17 and SiN film 18 have an effect of completely isolating elements. The operation of the semiconductor device was evaluated to confirm that the operation speed was higher and the leakage current of the memory cell was lower than those of a semiconductor device manufactured by a conventional technique.

In this fashion, a semiconductor substrate can be manufactured in which both the strained Si layer 21 on the surface and the relaxed Si region B3 having the relaxed Si layer 22 without stress are formed at almost the same level. By using this semiconductor substrate, a higher-speed, higher-performance semiconductor device than a semiconductor device manufactured by a conventional method can be manufactured.

Fourth Embodiment

Figure 10:
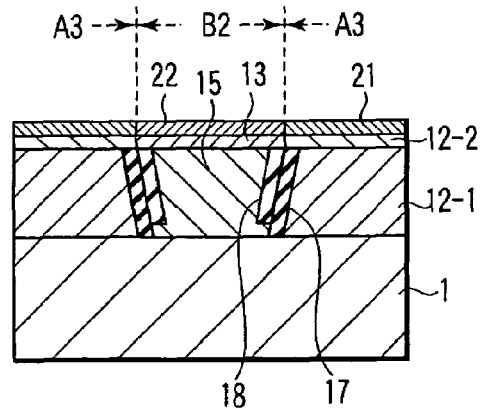
FIG. 10 is a sectional view showing an example of a semiconductor substrate according to the fourth embodiment.

The fourth embodiment concerns a substrate applied to a CMOS semiconductor device, similar to the second embodiment. As shown in FIG. 10, the semiconductor substrate according to the fourth embodiment has a strained Si region A3 including a strained Si layer 21 that is epitaxially grown on a relaxed SiGe layer 12-2 on an Si substrate 1, and a relaxed Si region B2 including a relaxed Si layer 22 without stress that is epitaxially grown on a strained SiGe layer 13 on an Si layer 15 formed on the Si substrate 1. This semiconductor substrate, therefore, has the strained Si region A3 and relaxed Si region B2 at almost the same level. According to the feature of the semiconductor substrate, control of the film thicknesses of the strained Si layer 21 and relaxed Si layer 22 is facilitated at high quality.

The manufacturing process of the fourth embodiment will be explained with reference to FIGS. 11A to 11F.

Figure 11A:
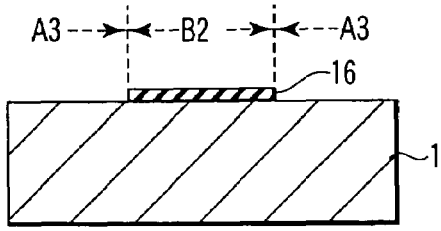
FIGS. 11A to 11F are sectional views for explaining an example of a semiconductor substrate manufacturing process according to the fourth embodiment.

(1) As shown in FIG. 11A, an $SiO_2$ film 16 is formed to a thickness of 100 nm by, e.g., thermal oxidization or CVD on an Si substrate 1. The $SiO_2$ film 16 in the prospective formation region of the strained Si region A3 is patterned and removed to expose the Si substrate 1.

Figure 11D:
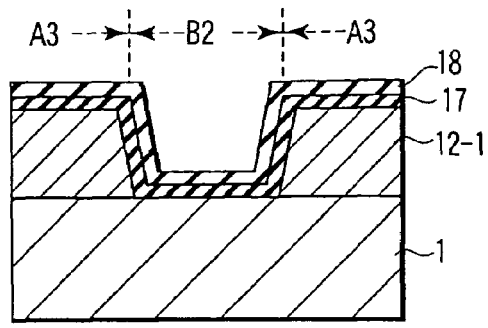
Figure 11B:
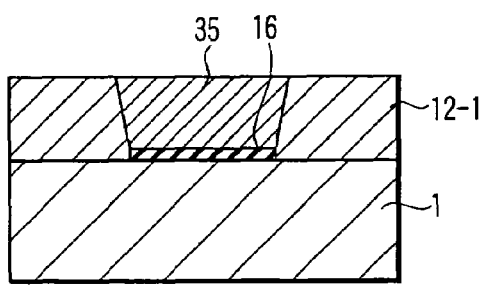

(2) As shown in FIG. 11B, a relaxed SiGe layer 12-1 is epitaxially grown to a thickness of, e.g., 2 μm on the Si substrate 1 in the region A3. At this time, a poly-SiGe layer 35 is formed on the $SiO_2$ film 16 in the region B2.

The relaxed SiGe layer 12 can be formed by solid phase epitaxial growth instead of vapor phase epitaxial growth. The relaxed SiGe layer 12-1 can be formed as a so-called graded SiGe layer in which the Ge concentration is low near the Si substrate 1 and increases along with growth. The strain of the SiGe layer 12-1 was evaluated by X-ray diffraction analysis to confirm that 98% of the entire structure was the relaxed SiGe layer 12-1 whose lattices were relaxed.

After the SiGe layer 12-1 with a predetermined thickness is formed, the surface is planarized by CMP.

Figure 11E:
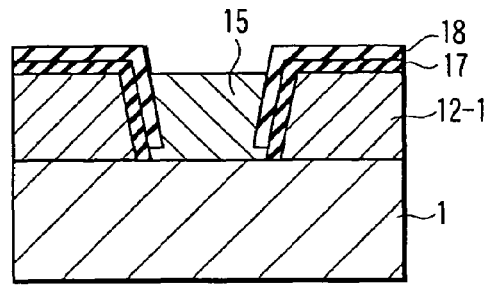
Figure 11C:
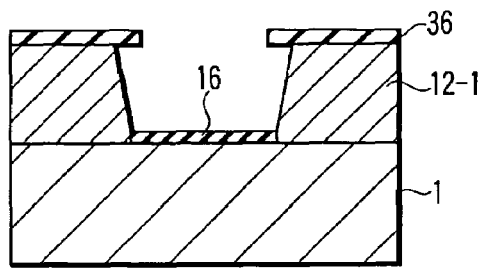

(3) As shown in FIG. 11C, for example, an $SiO_2$ film 36, serving as a mask, is formed on the entire surface, and patterned to expose the poly-SiGe layer 35. The mask can be formed by another material such as an SiN film other than $SiO_2$.

The poly-SiGe layer 35 is removed by, e.g., RIE using the $SiO_2$ film 36 as a mask. The poly-SiGe layer 35 can be removed by wet etching as far as the selectivity between poly-SiGe and single-SiGe is high.

(4) The mask $SiO_2$ film 36 and the $SiO_2$ film 16 on the surface of the Si substrate 1 in the region B2 are removed. As shown in FIG. 11D, a second $SiO_2$ film 17 and SiN film 18 are formed on the entire surface by, e.g., thermal oxidization and CVD, respectively.

(5) As shown in FIG. 11E, the SiN film 18 above the Si substrate 1 in the region B2 is removed by, e.g., RIE, and the second $SiO_2$ film 17 is removed with, e.g., a dilute hydrofluoric acid solution, thus exposing the Si substrate 1. Subsequently, selective epitaxial growth is performed to form an epitaxial Si layer 15 on the exposed Si substrate 1. As selective epitaxial growth conditions of Si, for example, 0.25 slm of $SiH_2Cl_2$ and 0.1 slm of HCl are supplied using an $H_2$ carrier gas at a pressure of 10 Torr and a temperature of 800° C. The thickness of the epitaxial Si layer 15 can be set equal to that of the relaxed SiGe layer 12-1.

(6) Thereafter, the SiN film 18 and second $SiO_2$ film 17 which cover the surface of the relaxed SiGe layer 12-1 are sequentially removed by wet etching using a phosphoric acid-containing solution and dilute hydrofluoric acid.

An SiGe layer is epitaxially grown to a thickness of, e.g., 200 nm on the entire surface to form SiGe layers 12-2 and 13. Epitaxial growth conditions of the SiGe layer are, e.g., 0.4 slm of $SiH_2Cl_2$, 0.2 slm of $GeH_4$, a pressure of 10 Torr, and a temperature of 800° C. The SiGe layer 12-2 grown on the relaxed SiGe layer 12-1 is a relaxed SiGe layer, and the SiGe layer 13 grown on the epitaxial Si layer 15 is a strained SiGe layer.

Figure 11F:
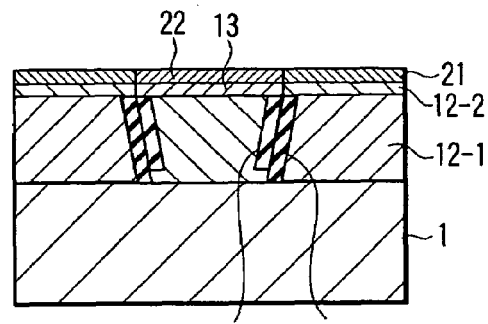

An Si layer is epitaxially grown to a thickness of, e.g., 20 nm on the entire surface to form Si layers 21 and 22. Epitaxial growth conditions are, e.g., 0.3 slm of $SiH_2Cl_2$ in an $H_2$ carrier gas, a pressure of 10 Torr, and a temperature of 800° C. Accordingly, as shown in FIG. 11F, the strained Si layer 21 and the relaxed Si layer 22 without stress can be formed at almost the same level on the relaxed SiGe layers 12-2 and 12-1 over the strained SiGe layer 13 on the epitaxial Si layer 15, respectively.

The strained state of the surface of the semiconductor substrate manufactured according to the fourth embodiment was evaluated by Raman spectroscopy analysis. It was confirmed that the strained Si layer 21 was formed on the relaxed SiGe layers 12-1 and 12-2 and the relaxed Si layer 22 without stress was formed on the strained SiGe layer 13 on the Si substrate 1.

Figure 12:
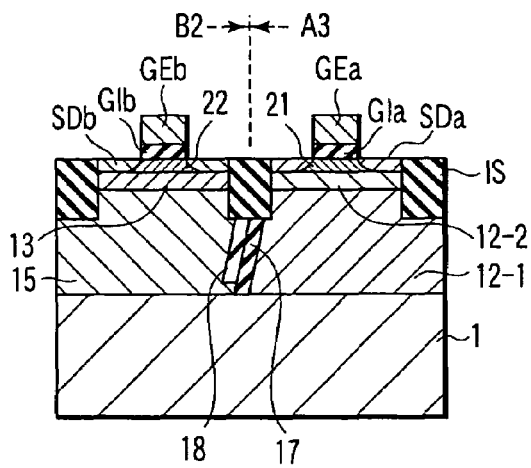
FIG. 12 is a sectional view showing an example of a semiconductor device using the semiconductor substrate according to the fourth embodiment.

As shown in FIG. 12, after forming an isolation IS in the semiconductor substrate, in the strained Si region A3, for example, an nMOS having a source/drain SDa, gate insulator GIa, and gate electrode GEa is formed. In the relaxed Si region B2, for example, a pMOS having a source/drain SDb, gate insulator GIb, and gate electrode GEb is formed. The pMOS is so manufactured as to form a channel in the strained SiGe layer 13. In the semiconductor device, the $SiO_2$ film 17 and SiN film 18 partially remain below the isolation IS at the interface between the strained Si region A3 and the relaxed Si region B2. The $SiO_2$ film 17 and SiN film 18 have an effect of completely isolating elements. As a result of evaluating the operation of the semiconductor device, the switching speeds of both the nMOS and pMOS increased in comparison with a semiconductor device manufactured by a conventional technique.

Accordingly, a semiconductor substrate can be manufactured in which both the strained Si region A3 having the strained Si layer 21 on the surface and the relaxed Si region B2 having the relaxed Si layer 22 without stress are formed at almost the same level. By using this semiconductor substrate, a higher-speed, higher-performance semiconductor device than a semiconductor device manufactured by a conventional method can be manufactured.

Fifth Embodiment

Figure 13:
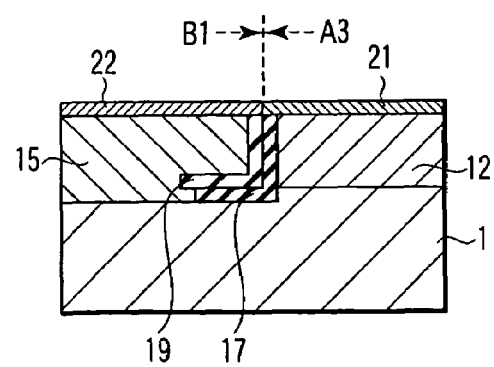
FIG. 13 is a sectional view showing an example of a semiconductor substrate according to the fifth embodiment.

The fifth embodiment uses, as a starting material, a bulk strained Si substrate 2 prepared by forming a strained Si layer 14 on, e.g., a 2 µm thick relaxed SiGe layer 12 on an Si substrate 1. A semiconductor substrate according to the fifth embodiment has a strained Si region A3 including a strained Si layer 21 on the relaxed SiGe layer 12, and a relaxed Si region B1 including a relaxed Si layer 22 without stress on a selective epitaxial Si layer 15, by epitaxially growing Si on the entire surface, as shown in FIG. 13. That is, this semiconductor substrate has the strained Si region A3 and relaxed Si region B1 at almost the same level. As the features of the semiconductor substrate, the film thickness of the strained Si layer 21 can be easily controlled, and a high-quality strained Si region A3 and relaxed Si region B1 can be formed.

The manufacturing process will be explained with reference to FIGS. 14A to 14F.

Figure 14A:
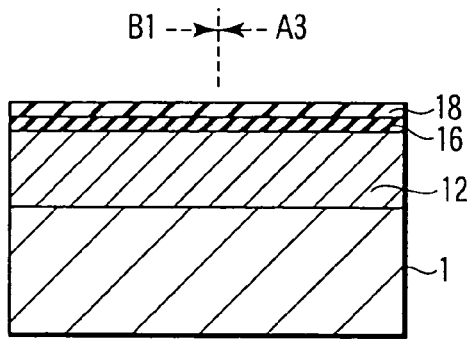
FIGS. 14A to 14F are sectional views for explaining an example of a semiconductor substrate manufacturing process according to the fifth embodiment.

(1) As shown in FIG. 14A, an entire strained Si layer 14 of a bulk strained Si substrate 2 is thermally oxidized. A formed oxide film is removed with a dilute hydrofluoric acid-containing solution to expose a relaxed SiGe layer 12. The strained Si layer 14 can also be etched away using a solution containing a mixture of fluoric acid and nitric acid. Note that a relaxed SiGe substrate having no strained Si layer 14 can also be adopted. In this case, a step of removing the strained Si layer 14 can be omitted. An $SiO_2$ film 16 and SiN film 18 are sequentially deposited on the entire surface of the SiGe layer 12 by, e.g., CVD.

Figure 14D:
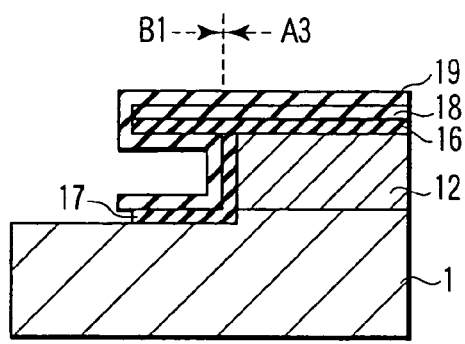
Figure 14B:
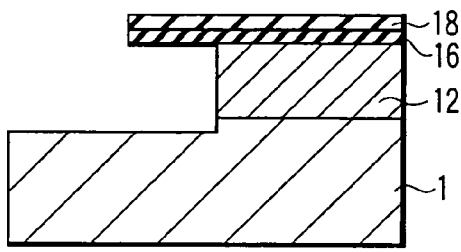

(2) As shown in FIG. 14B, the $SiO_2$ film 16 and SiN film 18 in the region B1 where a relaxed Si layer is to be formed are patterned, then are removed. The relaxed SiGe layer 12 in the region B1 is etched away. Etching is preferably isotropic etching using a solution. The SiGe layer 12 can be completely removed by simultaneously etching part of the Si substrate 1.

Figure 14E:
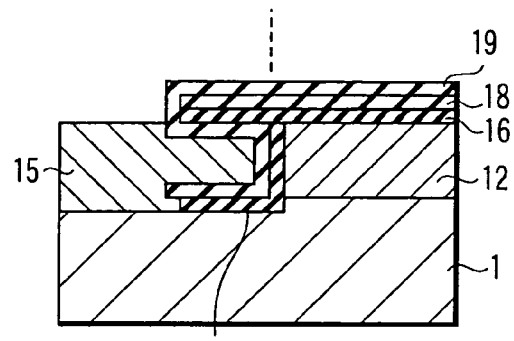
Figure 14C:
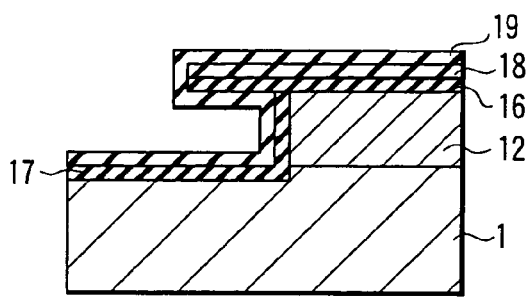

(3) As shown in FIG. 14C, a second $SiO_2$ film 17 is formed by thermal oxidization. Subsequently, a second SiN film 19 is deposited on the entire surface by, e.g., CVD.

(4) As shown in FIG. 14D, the second SiN film 19 deposited above the Si substrate 1 is etched by, e.g., RIE. The exposed second $SiO_2$ film 17 is removed by wet etching to expose the Si substrate 1. Etching of the second $SiO_2$ film 17 can be ion etching such as RIE, but wet etching is preferable so as not to damage the surface of the Si substrate 1.

(5) As shown in FIG. 14E, an Si layer 15 is selectively epitaxially grown on the surface of the exposed Si substrate 1. As selective epitaxial growth conditions of Si, for example, 0.25 slm of $SiH_2Cl_2$ and 0.1 slm of HCl are supplied using an $H_2$ carrier gas at a pressure of 10 Torr and a temperature of 800° C. The thickness of the epitaxial Si layer 15 can be set equal to the thickness of the relaxed SiGe layer 12. If any damage exists on the surface of the Si substrate 1 in step (4), the crystallinity of the selectively epitaxially grown Si layer 15 degrades. In place of selective epitaxial growth, the epitaxial Si layer 15 can be grown by solid phase epitaxial growth.

Figure 14F:
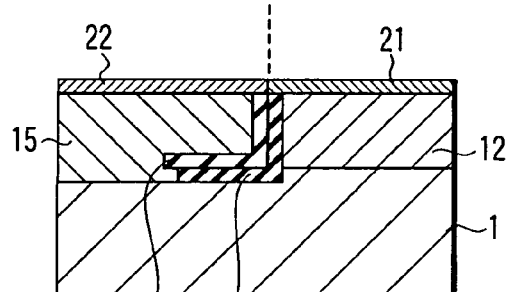

(6) The SiN films 18 and 19 and the $SiO_2$ films 16 and 17 which cover the relaxed SiGe layer 12 are sequentially removed by wet etching using a phosphoric acid-containing solution and dilute hydrofluoric acid. An Si layer is epitaxially grown on the entire surface to form Si layers 21 and 22. Epitaxial growth is done to a thickness of 20 nm by using 0.3 slm of an $SiH_2Cl_2$ source gas at a pressure of 10 Torr and a temperature of 800° C. The growth rate can be controlled by the temperature and pressure. The growth rate was 3 to 450 Å/min at a temperature of 700° C. to 800° C. and a pressure of 10 to 60 Torr. By the epitaxial growth, as shown in FIG. 14F, the strained Si layer 21 and the relaxed Si layer 22 without stress can be formed at almost the same level on the relaxed SiGe layer 12 and the epitaxial Si layer 15, respectively.

The strained state of the surface of the semiconductor substrate manufactured according to the fifth embodiment was evaluated by Raman spectroscopy analysis. It was confirmed that the strained Si layer 21 was formed on the relaxed SiGe layer 12 and the relaxed Si layer 22 without stress was formed on the epitaxial Si layer 15.

Figure 15:
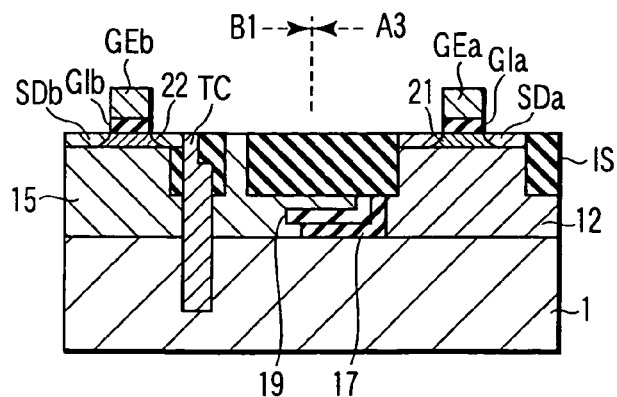
FIG. 15 is a sectional view showing an example of a semiconductor device using the semiconductor substrate according to the fifth embodiment.

As shown in FIG. 15, in the strained Si region A3, for example, an nMOS having, a source/drain SDa, gate insulator GIa, and gate electrode GEa is formed. In the relaxed Si region B1, for example, a trench DRAM cell having a source/drain SDb, gate insulator GIb, gate electrode GEb, and trench capacitor TC is formed. In the semiconductor device, the $SiO_2$ film 17 and SiN film 19 partially remain below the isolation IS at the interface between the strained Si region A3 and the relaxed Si region B1. The $SiO_2$ film 17 and SiN film 19 have an effect of completely isolating elements. The operation of the semiconductor device was evaluated to confirm that the operation speed was higher and the leakage current of the memory cell was lower than those of a semiconductor device manufactured by a conventional technique.

Hence, a semiconductor substrate can be manufactured in which both the strained Si region A3 having the strained Si layer 21 on the surface and the relaxed Si region B1 having the relaxed Si layer 22 without stress are formed at almost the same level. By using this semiconductor substrate, a higher-speed, higher-performance semiconductor device than a semiconductor device manufactured by a conventional method can be manufactured.

First Modification to Fifth Embodiment

In the first modification, a number of manufacturing steps in the fifth embodiment is reduced and so modified as to be suited to high integration. The first modification employs, as a starting material, a relaxed SiGe substrate 5 prepared by forming, e.g., a 2 µm thick relaxed SiGe layer 12 on an Si substrate 1. This can omit a step of removing a strained Si layer by, e.g., thermal oxidation. In addition, the first modification can prevent to concentrate Ge in the surface of the relaxed SiGe layer 12 due to unexpected thermal oxidation of the relaxed SiGe layer 12 during the removal step of the strained Si layer. The relaxed SiGe layer 12 in the region A3, where strained Si is to be formed, is removed by anisotropic etching. Therefore, this modification can also prevent undercut below the mask SiN film 18 and $SiO_2$ film 16 by lateral etching, and is suitable for high integration.

Figure 16A:
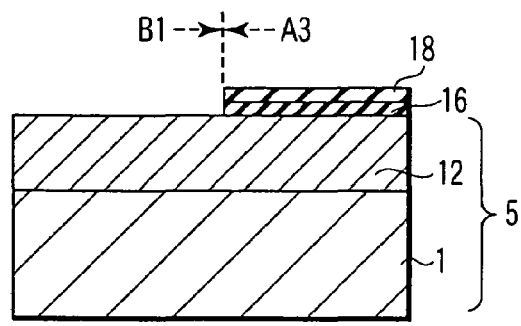
FIGS. 16A to 16C are sectional views showing an example of a semiconductor substrate according to the first modification to the fifth embodiment.

A process modified from the fifth embodiment will be explained with reference to FIGS. 16A to 16C.

(1) An $SiO_2$ film 16 and SiN film 18 are formed on the entire surface of a relaxed SiGe substrate 5. As shown in FIG.

16A, the SiO₂ film 16 and SiN film 18 in the relaxed Si region B1, where an unstrained Si layer is to be formed, are patterned and removed.

Figure 16B:
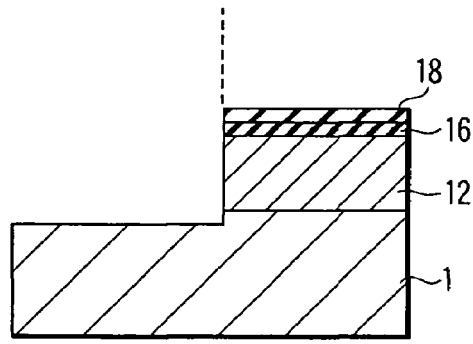
Figure 16C:
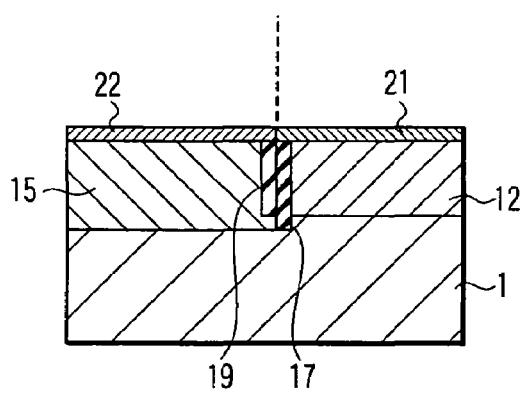

(2) Subsequently, as shown in FIG. 16B, the relaxed SiGe layer 12 and part of Si substrate 1 are removed by anisotropic etching-such as RIE using the SiO₂ film 16 and SiN film 18 as a mask. At this time, the anisotropic etching prevents lateral etching of relaxed SiGe layer 12 below the mask.

Thereafter, steps (3) to (6) in the fifth embodiment are executed. More specifically, a second SiO₂ film 17 and second SiN film 19 are formed on the entire surface. The second SiN film 19 and second SiO₂ film 17 on the Si substrate 1 are removed, and an Si layer 15 is formed on the exposed Si substrate 1 by selective epitaxial growth. The SiN films 18 and 19 and the SiO₂ films 16 and 17 on the surface of the relaxed SiGe layer 12 are removed, and an Si layer is epitaxially grown on the entire surface to form Si layers 21 and 22. Consequently, as shown in FIG. 16C, a semiconductor substrate can be formed in which the strained Si layer 21 and the relaxed Si layer 22 without stress can be formed at almost the same level on the relaxed SiGe layer 12 and the epitaxial Si layer 15, respectively. In the semiconductor substrate of the first modification, the width of the boundary region between the strained Si layer 21 and the relaxed Si layer 22 without stress can be narrowed as compared with the semiconductor substrate of the fifth embodiment.

The strained state of the surface of the semiconductor substrate manufactured according to the first modification was evaluated by Raman spectroscopy analysis. It was confirmed that the strained Si layer 21 was formed on the relaxed SiGe layer 12 and the relaxed Si layer 22 without stress was formed on the epitaxial Si layer 15.

On the semiconductor substrate, similar to FIG. 15, for example, an nMOS is formed in the strained Si region A3, and a trench DRAM cell is formed in the relaxed Si region B1. The operation of the semiconductor device was evaluated to confirm that the operation speed was higher and the leakage current of the memory cell was lower than those of a semiconductor device manufactured by a conventional technique.

A semiconductor substrate can be manufactured in which both the strained Si region A3 having the strained Si layer 21 on the surface and the relaxed Si region B1 having the relaxed Si layer 22 without stress are formed at almost the same level. By using this semiconductor substrate, a higher-speed, higher-performance semiconductor device than a semiconductor device manufactured by a conventional method can be manufactured.

Second Modification to Fifth Embodiment

In the second modification, a number of manufacturing steps of the fifth embodiment is reduced and so modified as to be suited to high integration. At the same time, the second modification avoids the possibility of damaging the Si substrate 1 by RIE in the forming process of the relaxed Si region B1 in the first modification. Similar to the first modification, the second modification uses, as a starting material, a relaxed SiGe substrate 5 prepared by forming, e.g., a 2 μm thick relaxed SiGe layer 12 on an Si substrate 1. The second modification can simplify the process, similar to the first modification to the fifth embodiment. Further, the relaxed SiGe layer 12 in the region A3 where strained Si is to be formed is removed by anisotropic etching, then, the Si substrate 1 is removed by wet etching. Undercut below the mask SiN film 18 and SiO₂ film 16 by lateral etching can be suppressed, and any damage to the Si substrate 1 by RIE can also be prevented.

Figure 17A:
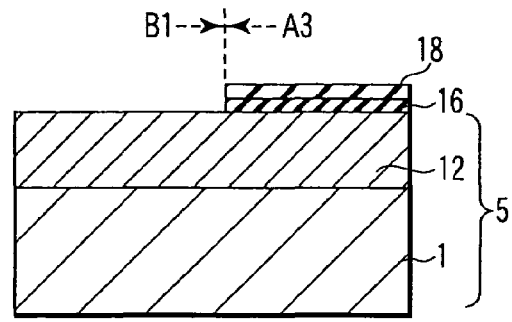
FIGS. 17A to 17C are sectional views showing an example of a semiconductor substrate according to the second modification to the fifth embodiment.

A process according to the second modification to the fifth embodiment will be described with reference to FIGS. 17A to 17C.

(1) Similar to the first modification, an SiO₂ film 16 and SiN film 18 are formed on the entire surface of a relaxed SiGe substrate 5. As shown in FIG. 17A, the SiO₂ film 16 and SiN film 18 in the relaxed Si region B1 where an unstrained Si layer is to be formed are patterned and removed.

Figure 17B:
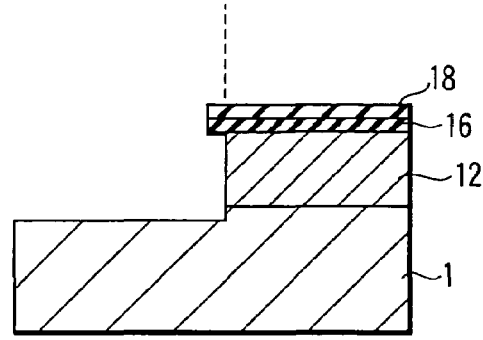
Figure 17C:
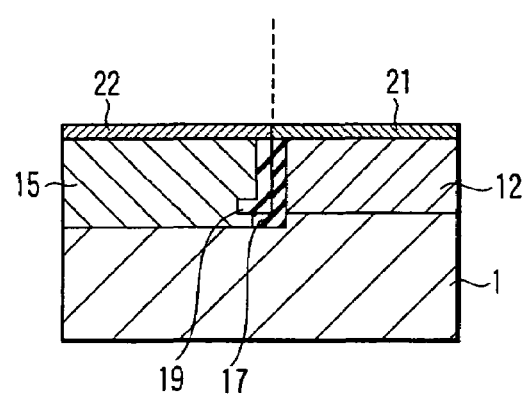
Figure 18A:
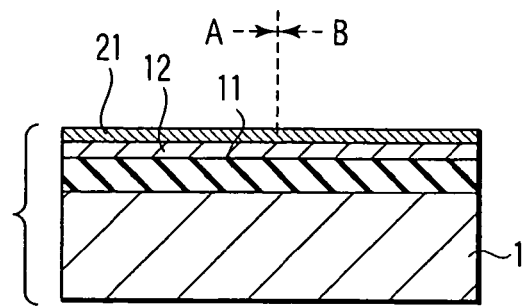
FIGS. 18A and 18B are sectional views showing an example of a semiconductor substrate manufacturing process according to the prior art.
Figure 18B:
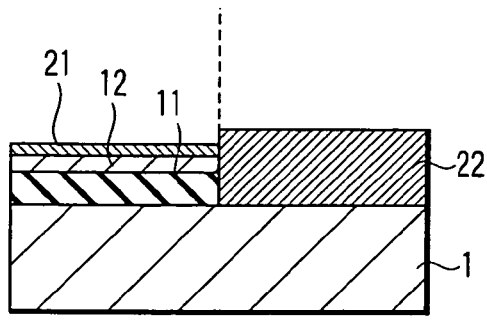
Figure 19A:
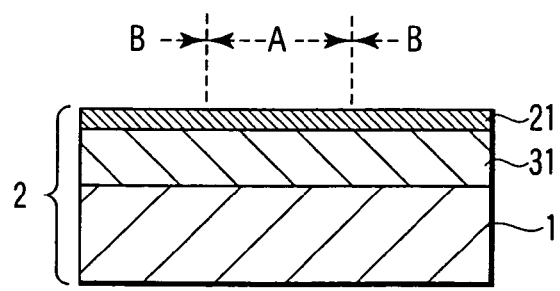
FIGS. 19A and 19B are sectional views showing another example of a semiconductor substrate manufacturing process according to the prior art.
Figure 19B:
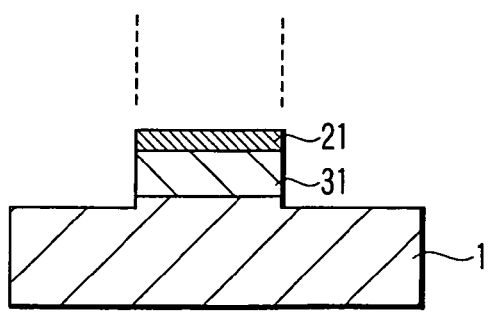

(2) Subsequently, as shown in FIG. 17B, a relaxed SiGe layer 12 in the region B1 is removed by anisotropic etching such as RIE using the SiO₂ film 16 and SiN film 18 as a mask. At this time, anisotropic etching suppresses lateral etching below the mask. Part of the Si substrate 1 is removed by wet etching. This hardly damages the surface of the Si substrate 1 and can suppress the undercut amount below the mask to very small. For the wet etching of the Si substrate 1, it can be used, e.g., a mixture of an alkaline solution and a hydrogen peroxide.

Thereafter, steps (3) to (6) in the fifth embodiment are executed. More specifically, a second SiO₂ film 17 and second SiN film 19 are formed on the entire surface. The second SiN film 19 and second SiO₂ film 17 on the Si substrate 1 are removed, and an Si layer 15 is formed on the exposed Si substrate 1 by selective epitaxial growth. The SiN films 18 and 19 and the SiO₂ film 16 on the surface of the relaxed SiGe layer 12 are removed, and an Si layer is epitaxially grown on the entire surface to form Si layers 21 and 22. As shown in FIG. 17C, a semiconductor substrate can be manufactured in which the strained Si layer 21 and the relaxed Si layer 22 without stress can be formed at almost the same level on the relaxed SiGe layer 12 and the epitaxial Si layer 15, respectively. In the semiconductor substrate of the second modification, the width of the boundary region between the strained Si layer 21 and the relaxed Si layer 22 without stress can be narrowed. At the same time, the second modification avoids the possibility of damaging the surface of the Si substrate 1 by RIE. As a result, the crystallinity of the epitaxial Si layer 15 can improve.

The strained state of the surface of the semiconductor substrate manufactured according to the second modification was evaluated by Raman spectroscopy analysis. It was confirmed that the strained Si layer 21 was formed on the relaxed SiGe layer 12 and the relaxed Si layer 22 without stress was formed on the epitaxial Si layer 15.

On the semiconductor substrate, similar to FIG. 15, for example, an nMOS is formed in the strained Si region A3, and a trench DRAM cell is formed in the relaxed Si region B1. The operation of the semiconductor device was evaluated to confirm that the operation speed was higher and the leakage current of the memory cell was lower than those of a semiconductor device manufactured by a conventional technique.

A semiconductor substrate can, therefore, be manufactured in which both the strained Si region A3 having the strained Si layer 21 on the surface and the relaxed Si region B1 having the relaxed Si layer 22 without stress are formed at almost the same level with the strained Si layer 21. By using this semiconductor substrate, a higher-speed, higher-performance semiconductor device than a semiconductor device manufactured by a conventional method can be manufactured.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor substrate, comprising:
    a support substrate including a first region and a second region, the second region being adjacent to the first region;
    a first insulating layer formed on the support substrate in the first region, the first insulating layer including a first side wall facing the second region;
    a relaxed silicon germanium (SiGe) layer formed on the first insulating layer, the relaxed SiGe layer including a second side wall facing the second region;
    a second insulating layer formed on the second side wall, the second insulating layer including a third side wall flush with the second side wall;
    a third insulating layer formed on the first and second side walls, the third insulating layer including a fourth side wall facing the second region and a lower end portion thereof spaced apart from a first upper surface of the support substrate;
    a silicon layer formed on the support substrate in the second region, the silicon layer including a fifth side wall contacting the first and fourth side walls;
    a strained silicon layer formed on the relaxed SiGe layer, the strained silicon layer including a second upper surface; and
    a relaxed silicon layer formed above the silicon layer, the relaxed silicon layer including a third upper surface flush with the second upper surface.

2. A semiconductor substrate, comprising:
    a support substrate;
    a first semiconductor region including a first silicon layer formed above the support substrate;
    a second semiconductor region including a strained second silicon layer formed on a silicon germanium layer enclosing a cavity disposed above the support substrate, a surface of the second silicon layer being formed at substantially a same level as a surface of the first silicon layer; and
    an insulating film formed at an interface between the first semiconductor region and the second semiconductor region.

3. The semiconductor substrate according to claim 1, wherein a height of the second upper surface of the strained silicon layer is the same as a height of the third upper surface of the relaxed silicon layer relative to the first upper surface of the support substrate.

4. The semiconductor substrate according to claim 1, wherein a thickness of the strained silicon layer is the same as a thickness of the relaxed silicon layer.

5. The semiconductor substrate according to claim 1, further comprising:
    a strained SiGe layer disposed between the silicon layer and the relaxed silicon layer.

6. The semiconductor substrate according to claim 1, wherein the first insulating layer includes a silicon oxide layer.

7. The semiconductor substrate according to claim 1, wherein the second insulating layer includes a silicon oxide layer.

8. The semiconductor substrate according to claim 7, wherein the third insulating layer includes a silicon nitride layer.

* * * * *